(12) United States Patent
Yonezawa et al.

(10) Patent No.: US 7,279,941 B2
(45) Date of Patent: Oct. 9, 2007

(54) VOLTAGE-FREQUENCY CONVERSION APPARATUS AND METHOD OF CHANGING REFERENCE VOLTAGE THEREOF

(75) Inventors: Yoshiaki Yonezawa, Gunma (JP); Tadao Senriuchi, Chiba (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/333,539

(22) Filed: Jan. 18, 2006

(65) Prior Publication Data

US 2006/0176119 A1    Aug. 10, 2006

(30) Foreign Application Priority Data

Jan. 21, 2005  (JP)  ............................. 2005-014614
Dec. 6, 2005   (JP)  ............................. 2005-351759

(51) Int. Cl.
*H03C 3/00* (2006.01)

(52) U.S. Cl. ........................................... 327/101; 327/100

(58) Field of Classification Search ................ 327/100, 327/101, 530, 531
See application file for complete search history.

(56) References Cited

U.S. PATENT DOCUMENTS

| 4,256,983 A | * | 3/1981 | Griffith et al. | ............... 327/101 |
| 4,316,155 A | * | 2/1982 | Hanisko | ....................... 331/18 |
| 4,390,799 A | * | 6/1983 | Schmoock | ................... 327/378 |
| 5,495,193 A | * | 2/1996 | Nukui | .......................... 327/101 |
| 5,585,748 A | * | 12/1996 | Yamaguchi et al. | ........ 327/101 |
| 6,169,428 B1 | * | 1/2001 | Mader | ......................... 327/101 |
| 6,653,872 B2 | * | 11/2003 | MacGugan | ................. 327/101 |

FOREIGN PATENT DOCUMENTS

JP    2002-107428    4/2002

* cited by examiner

*Primary Examiner*—Quan Tra
*Assistant Examiner*—Hai L. Nguyen
(74) *Attorney, Agent, or Firm*—Fish & Richardson P.C.

(57) ABSTRACT

A voltage-frequency conversion apparatus which comprises a variable current source for charging a capacitor; a current amount adjustment circuit which has a first resistor for applying a first voltage and a second resistor for applying a second voltage and adjusts the amount of a current from the variable current source to be corresponding to a differential voltage between the first voltage and the second voltage; a comparator that compares a charging voltage across the capacitor and a reference voltage; and a discharge circuit that discharges the capacitor when the charging voltage exceeds the reference voltage. The comparator generates a frequency signal according to the differential voltage. The conversion apparatus further comprises a reference voltage control circuit that, when a resistance of the first or second resistor varies according to its temperature characteristic, changes the value of the reference voltage according to the variation in the resistance so as to maintain constant a frequency of the frequency signal.

12 Claims, 5 Drawing Sheets

Prior Art
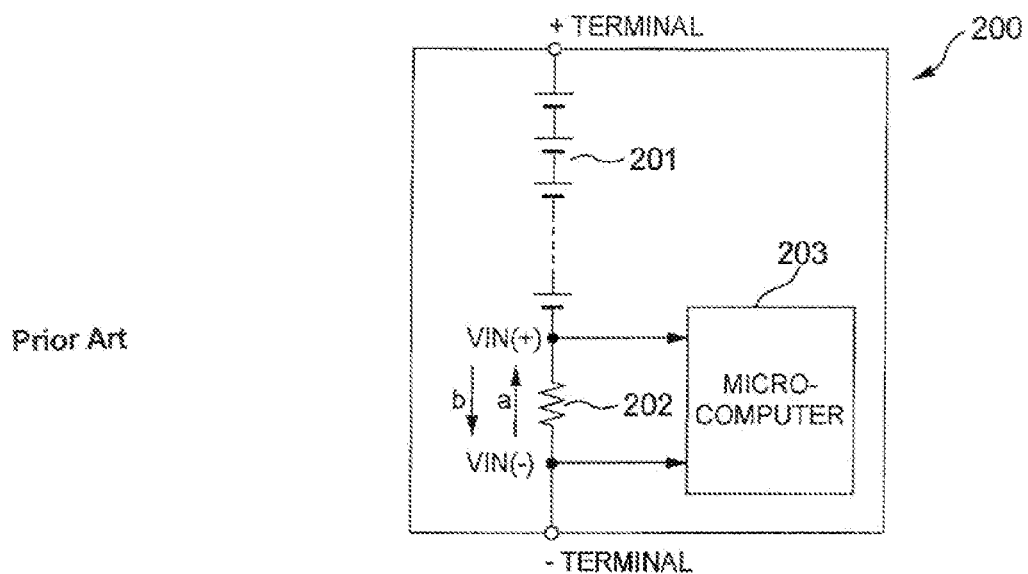
FIG. 6
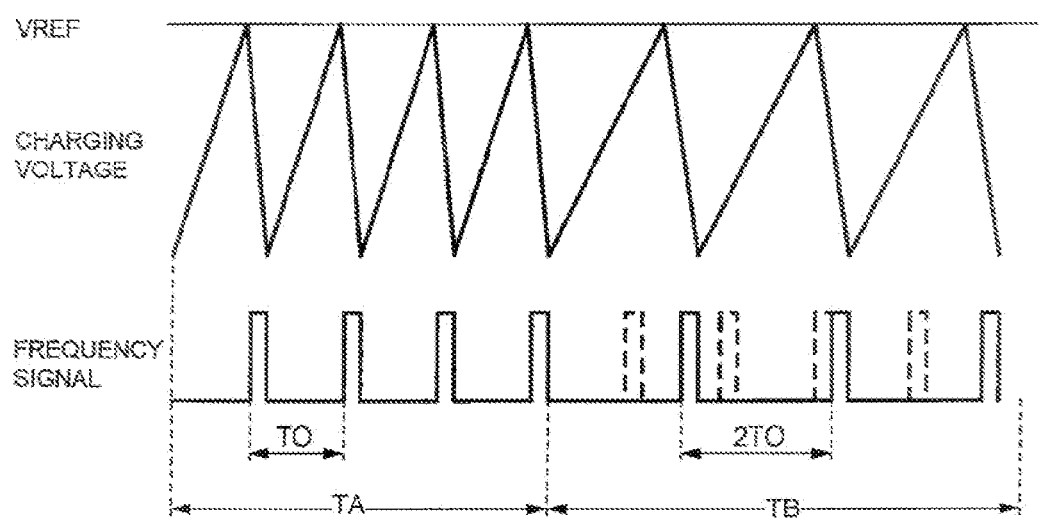
Prior Art             FIG. 7

VOLTAGE-FREQUENCY CONVERSION APPARATUS AND METHOD OF CHANGING REFERENCE VOLTAGE THEREOF

CROSS-REFERENCE TO RELATED APPLICATIONS

The present application claims priority from Japanese Patent Applications Nos. 2005-14614 and 2005-351759 filed on Jan. 21, 2005 and Dec. 6, 2005 respectively, which are herein incorporated by reference.

BACKGROUND OF THE INVENTION

1. Field of the Invention

The present invention relates to a voltage-frequency conversion apparatus and a method of changing a reference voltage of the voltage-frequency conversion apparatus, which are suitable for detecting the remaining voltage of electricity charged in a secondary battery, for example.

2. Description of the Related Art

Configuration of Conventional Voltage-Frequency Conversion Apparatus

<Overall Configuration>

With reference to FIG. 5, an example configuration of a conventional voltage-frequency conversion apparatus is described. FIG. 5 is a circuit block diagram showing the example configuration of a conventional voltage-frequency conversion apparatus.

A voltage-frequency conversion apparatus 100 shown in FIG. 5 has an error amplifier 102, a current source IA, variable current sources IB, IC, resistances RA, RB, p-type MOSFETs 104, 106, a reference voltage source 108, a comparator 110, a capacitor 112, a switch element 114 and control logic circuit 116.

The current source IA, the resistance RA and the source to drain of the p-type MOSFET are serially connected between the power supply VDD and ground. When the gate of the p-type MOSFET 104 is applied with a voltage VIN(−) with the resistance RA supplied with a current from the current source IA, a voltage V1 is produced at one end of the resistance RA. The value of this voltage level V1 is decided by the value of the voltage VIN(−). Whereas the variable current source IB, the resistance RB, p-type MOSFET 106 are serially connected between power supply VDD and ground. When the gate of the p-type MOSFET 106 is applied with a voltage VIN(+) with the resistance RB supplied with a current from the current source IB, a voltage V2 is produced at one end of the resistance RB. The value of this voltage V2 is decided by the value of the voltage VIN (+).

An input of the error amplifier 102 is connected to one end of the resistance RA at which the voltage V1 is produced, and the other input is connected to one end of the resistance RB at which the voltage V2 is produced. In other words, the error amplifier 102 performs a negative feedback operation to equalize voltages V2 and V1 according to the differential voltage between voltages V1, and V2. The variable current source IB is controlled by the output voltage from the error amplifier 102 to adjust the amount of current. Here, in the case the error amplifier 102 performs a negative feedback operation on the variable current source IB to equalize voltages V2 and V1, for example, when the voltage V2 becomes lower than voltage V1 and the differential voltage between voltages V1 and V2 increases due to the voltage VIN (+) becoming lower than the voltage VIN (−), the error amplifier 102 produces an output voltage to increase the amount of current of the variable current source IB so as to null the difference between voltages V1 and V2.

The amount of current generated from the variable current source IC is controlled according to the output voltage from the error amplifier 102. In other words, when the error amplifier 102 produces an output voltage to increase the current of the variable current source IB, the variable current source IC generates a larger current according to this output voltage. The variable current source IC and the capacitor 112 are serially connected between the power supply VDD and ground, and thus the capacitor 112 is charged by the current generated from the variable current source IC. In other words, the larger the current generated from the variable current source IC is, the quicker the capacitor 112 is charged whereas the smaller the current generated from the variable current source IC is, the slower the capacitor 112 is charged.

The comparator 110 compares a charging voltage occurring at one end of the capacitor 112 on the non-grounded side and a constant reference voltage VREF generated by the reference voltage source 108. In FIG. 5, the charging voltage of the capacitor 112 is applied to a plus (non-inverting input) terminal of the comparator 110 and the reference voltage VREF is applied to a minus (inverting input) terminal of the comparator 110. Therefore, the comparator 110 outputs a low level if the charging voltage of the capacitor 112 is smaller than the reference voltage VREF and outputs a high level if the charging voltage of the capacitor 112 exceeds the reference voltage VREF. In other words, the comparator 110 outputs a rectangular frequency signal corresponding to the differential voltage between the voltages V1 and V2.

The switch element 114 is connected in parallel with the capacitor 112. A bipolar transistor, a MOSFET, etc., can be employed as the switch element 114.

The control logic circuit 116 is connected to the output of the comparator 110 and controls the turning on/off of the switch element 114. In other words, the control logic circuit 116 renders the switch 114 on for a certain period after the output of the comparator 110 becomes a high level. In this period, the capacitor 113 is discharged through the switch element 114.

Operation of Conventional Voltage-Frequency Conversion Apparatus

With reference to FIG. 5 and FIG. 7, the operation of the voltage-frequency conversion apparatus 100 is described. FIG. 7 is a waveform diagram showing a relationship between the charging voltage appearing at one end of the capacitor 112 and a frequency signal output from the comparator 110. A rate (gradient) of increase in the charging voltage of the capacitor 112 varies according to the amount of the current supplied from the variable current source IC. In other words, as the current supplied from the variable current source IC becomes larger, the gradient of the increasing charging voltage of the capacitor 112 changes in a direction of becoming steeper, and the smaller the current supplied from the variable current source IC, the gradient becomes more gradual.

For example, an operation when the charging voltage takes a waveform in period TA in FIG. 7 is described. When there is a relationship that voltage VIN(+) equals VIN(−) +/− $\Delta V$, in other words, when the differential voltage between voltages VIN(+) and VIN(−) is $\Delta V$, a differential voltage of V1−V2 which corresponds to the differential voltage $\Delta V$, is initially generated. Then, the error amplifier 102 produces an output voltage to null the differential voltage V1−V2. For example, when the differential voltage $\Delta V$ is positive, there is a relationship that voltage V1<voltage V2 and therefore, the error amplifier 102 produces an output voltage to reduce the current supplied from the variable current source IB. Also, this output voltage increases the current supplied from the variable current source IC. On the other hand, when the differential voltage ΔV is negative, there is a relationship that voltage V1>voltage V2 and therefore, the error amplifier 102 produces an output voltage to increase the current supplied from the variable current source IB. Also, this output voltage reduces the current supplied from the variable current source IC. In this way, the variable current source IC generates a current according to the output voltage supplied from the error amplifier 102, and the capacitor 112 is charged by the current supplied from the variable current source IC. Thus the charging voltage of the capacitor 112 increases with a gradient as in period TA to null the differential voltage between voltages V1 and V2. When the charging voltage of the capacitor 112 is lower than the reference voltage VREF, the output of the comparator 110 is at a low level.

Thereafter, when the charging voltage of the capacitor 112 exceeds the reference voltage VREF, the output of the comparator 110 becomes a high level. The control logic circuit 116 renders the switch element 114 on for a certain period after the output of the comparator 110 becomes the high level. In other words, a discharge path is formed for the capacitor 112. Therefore, the capacitor 112 immediately discharges through the switch element 114. The certain period in which the control logic circuit 116 renders the switch element 114 on is a period required for completing the discharge of the capacitor 112 and is decided in consideration of the capacity of the capacitor 112, etc. and preset in the control logic circuit 116. If the charging voltage of the capacitor 112 becomes smaller than the reference voltage VREF, the output of the comparator 110 becomes the low level again. Thus, the comparator 110 outputs to the capacitor 11 a frequency signal with a period of TO in response to the charging voltage.

Consequently, the voltage-frequency conversion apparatus 100 converts the differential voltage between voltages VIN(+) and VIN(−) into a frequency signal that corresponds to the differential voltage.

Example Application of Voltages V(+) and V(−)

The voltage-frequency conversion apparatus 100 can be employed as an apparatus for determining the remaining voltage of electricity charged in a secondary battery for example.

FIG. 6 is a schematic configuration diagram showing a battery pack incorporating a secondary battery. In FIG. 6, the battery pack 200 incorporates a secondary battery 201, a sensing resistor 202, a microcomputer 203 (or a logic integrated circuit), etc. The secondary battery 201 and the sensing resistor 202 are serially connected between a plus terminal and a minus terminal to be electrically connected to an electronic device using the secondary battery 201 as a power source. When the secondary battery 201 is charged or discharged, the sensing resistor 202 produces voltages VIN(+) and VIN(−) at both its ends. For example, if the battery pack 200 is mounted in an electronic device, the secondary battery 201 discharges to supply power to the electronic device and a discharge current flows in an a-direction (upwards on the page) through the sensing resistor 202. In other words, when the secondary battery 201 discharges, the voltage VIN(+) becomes lower than the voltage VIN(−). The smaller the discharging amount of the second battery 201 is, the greater the differential voltage between the voltage VIN(+) and the voltage VIN(−) becomes. On the other hand, if the battery pack 200 is mounted in a charger (not shown), the secondary battery 201 is charged and a charging current flows in a b-direction (downwards on the page) through the sensing resistor 202. In other words, when the secondary battery 201 is charged, the voltage VIN(+) becomes higher than the voltage VIN(−). The larger the charging amount of the second battery 201 is, the greater the differential voltage between the voltage VIN(+) and the voltage VIN(−) becomes.

The voltages VIN(+) and VIN(−) are supplied to the microcomputer 203 as voltage information which is the basis for determining the remaining voltage of electricity when the secondary battery 201 discharges or the charging voltage when the secondary battery 201 is charged. The microcomputer 203 incorporates the voltage-frequency conversion apparatus 100. Hence, the microcomputer 203 can detect the levels of the voltages V1 and V2 that are produced when voltages VIN(+) and VIN(−) are applied, as well as the differential voltage between voltages V1 and V2, and obtain a frequency signal according to the amount of current of the variable current source IC that nulls the differential voltage. The microcomputer 203 performs appropriate program processing on the obtained frequency signal thereby obtaining the remaining voltage of electricity and the usable time for the remaining voltage of electricity when the secondary battery 201 is mounted in an electronic device, and the charging voltage while being charged. (Refer to, e.g., Japanese Patent Application Laid-open Publication No. 2002-107428.)

The resistors RA and RB used in the voltage-frequency conversion apparatus 100 have a temperature characteristic that their resistances vary depending on the temperature of the resistors themselves or the ambient temperature.

When the differential voltage between voltages VIN(+) and VIN(−) is at ΔV, and the differential voltage V1−V2 between voltages V1 and V2 decided by voltages VIN(+) and VIN(−) is not null, the error amplifier 102 produces an output voltage to null the differential voltage V1−V2. The capacitor 112 is charged by a current provided from the variable current source IC. It is assumed that, for the case where the resistances of resistors RA and RB do not vary depending on the temperature, the increase gradient of the charging voltage of the capacitor 112 is, for example, the gradient in period TA. In other words, when the resistances RA and RB do not vary depending on the temperature, the comparator 110 is in a state of outputting a frequency signal with a period of TO.

When the resistance of at least either resistor RA or resistor RB varies depending on the temperature from this state, although the differential voltage between voltages VIN(+) and VIN(−) is ΔV, the output voltage of the error amplifier 102 shifts from an output voltage value that nulls the differential voltage V1−V2 corresponding to the differential voltage ΔV. As a result, the problem occurs that the frequency of the frequency signal output from the comparator 110 deviates from the true frequency.

As an illustrative example, in period TB of FIG. 7, a case when the resistance of resistor RB increases depending on its own temperature (e.g. when the resistance value of resistance RB doubles) is considered. When the resistance of resistor RB doubles due to the temperature characteristic, a change is made from a state where voltage V2 is equal to voltage V1, which is achieved by the negative feedback operation by the error amplifier 102 that produces an output voltage to null the differential voltage between voltages V1 and V2, to a state where voltage V2 is higher than voltage V1. Accordingly, the error amplifier 102 produces an output voltage to change the current supplied from the variable current source IB to a current value that is half the previous value in order to bring back voltage V2 to become equal to voltage V1. Hence, not only the current value of the current supplied from the variable current source IB but also that from the variable current source IC is changed to half its previous value. As a result, since the current per unit of time supplied from the variable current source IC to the capacitor 112 is reduced to half, the rise gradient while the capacitor 112 is being charged is half of that in period TA. Therefore, although the differential voltage between voltages VIN(+) and VIN(−) is ΔV, the problem occurs of faulty generation of a frequency signal from the comparator 110 with a period of 2TO that is twice the true period of TO (dashed line).

For example, when the voltage-frequency conversion apparatus 100 is incorporated in a microcomputer 203 used in the battery pack 200 and the battery pack 200 is mounted in an electric device, the remaining voltage of electricity in the secondary battery 201 can be detected. However, since the microcomputer 203 determines the remaining voltage of electricity based on the frequency of the frequency signal obtained from the comparator 110, if such a false frequency signal is generated, the determined remaining voltage of electricity is quite apart from a true remaining voltage of electricity and thus causes a great deal of trouble for the user of the electronic device.

FIG. 8 is a graph showing an input-output characteristic of a voltage-frequency conversion apparatus. In FIG. 8, the horizontal axis shows a differential voltage [V] between the voltages VIN(+) and VIN(−), and the vertical axis shows the frequency signal [Hz] output from the comparator 110. The differential voltage between the voltages VIN(+) and VIN(−) and the frequency signal ideally has proportionality as shown by the solid line. However, when at least either resistor RA or resistor RB varies depending on the temperature, the relationship of the differential voltage between the voltages VIN(+) and VIN(−) with the frequency of the frequency signal output from the comparator 110 deviates from the characteristic shown by the solid line to the dot-and-dash line side or the dashed line side.

SUMMARY OF THE INVENTION

An object of the present invention is to maintain good voltage-frequency conversion accuracy even if the resistance of a resistor forming part of a voltage-frequency conversion apparatus varies according to its temperature characteristic.

According to the invention to solve the above and other problems, there is a voltage-frequency conversion apparatus which comprises a variable current source for charging a capacitor; a current amount adjustment circuit which has a first resistor for applying a first voltage and a second resistor for applying a second voltage and adjusts the amount of a current from the variable current source to be corresponding to a differential voltage between the first voltage and the second voltage; a comparator that compares in level a charging voltage produced at one end of the capacitor and a reference voltage, and generates a frequency signal according to the differential voltage between the first voltage and the second voltage; a discharge circuit that discharges the capacitor according to the comparing result of the comparator when the charging voltage exceeds the reference voltage; and a reference voltage control circuit that, when a resistance of the first resistor or the second resistor varies according to its temperature characteristic, changes the value of the reference voltage according to the variation in the resistance of the first resistor or the second resistor so as to maintain constant a frequency of the frequency signal from the comparator.

Furthermore, there is provided a method for changing a reference voltage of a voltage-frequency conversion apparatus which has a variable current source for charging a capacitor; a current amount adjustment circuit which has a first resistor for applying a first voltage and a second resistor for applying a second voltage and adjusts the amount of a current from the variable current source to be corresponding to a differential voltage between the first voltage and the second voltage; a comparator that compares in level a charging voltage produced at one end of the capacitor and a reference voltage, and generates a frequency signal according to the differential voltage between the first voltage and the second voltage; and a discharge circuit that discharges the charging voltage of the capacitor according to the comparing result of the comparator when the charging voltage exceeds the reference voltage. The method comprises changing the value of the reference voltage according to the variation in a resistance of the first resistor or the second resistor when the resistance of the first resist or the second resist varies according to its temperature characteristic, so as to maintain constant a frequency of the frequency signal from the comparator.

According to the present invention, good voltage-frequency conversion accuracy can be maintained even though the resistance of a resistor forming part of the voltage-frequency conversion apparatus varies depending on the temperature.

Features and objects of the present invention other than the above will become clear by reading the description of the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings wherein:

FIG. 6 is a circuit block diagram showing a battery pack as an example of employing a voltage-frequency conversion apparatus;

FIG. 7 is a waveform diagram showing the operation of the conventional voltage-frequency conversion apparatus;

DETAILED DESCRIPTION OF THE INVENTION

At least the following matters will be made clear by the explanation in the present specification and the description of the accompanying drawings.

Configuration of Voltage-Frequency Conversion Apparatus

<Overall Configuration>

Figure 1:
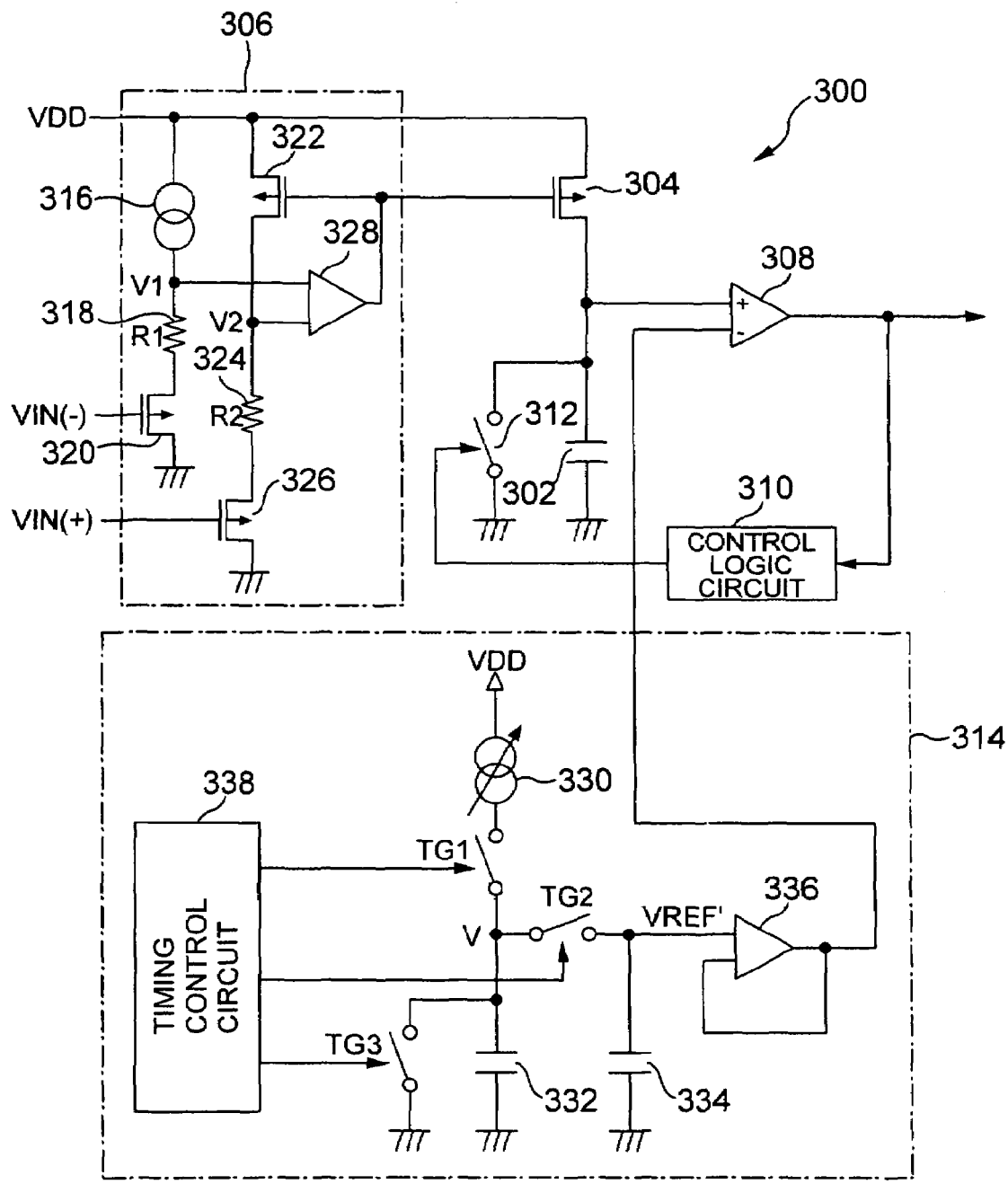
FIG. 1 is a circuit block diagram showing a voltage-frequency conversion apparatus according to the present invention.

With reference to FIG. 1, an example configuration of a voltage-frequency conversion apparatus according to the present invention is described. FIG. 1 is a circuit block diagram showing an example configuration of a voltage-frequency conversion apparatus according to the present invention.

The voltage-frequency conversion apparatus 300 shown in FIG. 1 includes a capacitor 302, a p-type MOSFET 304 (variable current source), a current amount adjustment circuit 306, a comparator 308 (comparing circuit), a control logic circuit 310 and a switch element 312 (discharging circuit), and a reference voltage control circuit 314.

The current amount adjustment circuit 306 has a current source 316, a first resistor 318 with a resistance of R1, a p-type MOSFET 320 (first-voltage transistor), a p-type MOSFET 322 (first current supply transistor), a second resistor 324 with a resistance of R2, a p-type MOSFET 326 (second-voltage transistor) and an error amplifier 328 (current amount adjustment error amplifier).

The current source 316, the resistor 318 and the source to drain of the p-type MOSFET 320 are serially connected between the power supply VDD and ground. When the voltage VIN(−) is applied to the gate of the p-type MOSFET 320, voltage V1 is produced at the connection point of the current source 316 and the first resistor 318, which is the sum of the voltage VIN(−) and the gate-to-source voltage of the p-type MOSFET 320 and the voltage across the resistor 318 when a current is supplied from current source 316. That is, if the current supplied from the current source 316 is constant, the value of voltage V1 is decided by the value of the voltage VIN(−). Meanwhile, the source to drain of the p-type MOSFET 322, the second resistor 324, and the p-type MOSFET 326 are serially connected between the power supply VDD and ground. When the voltage VIN(+) is applied to the gate of the p-type MOSFET 326, voltage V2 is produced at the connection point of the drain of the p-type MOSFET 322 and the resistor 324, which is the sum of the voltage VIN(+) and the gate-to-source voltage of the p-type MOSFET 326 and the voltage across the second resistor 324 when a current is supplied from the p-type MOSFET 322. That is, if the current supplied from the current source 322 is constant, the value of the voltage V2 is decided by the value of the voltage VIN(−). The voltage V1 is applied to one input terminal of the error amplifier 328 and the voltage V2 is applied to the other input terminal. Then, the error amplifier 328 feeds back an output voltage as a control voltage to the gate of the p-type MOSFET 322, in order to equalize voltages V2 and V1 to null the differential voltage between voltages V1 and V2. When the voltage V1 is smaller than voltage V2, the error amplifier 328 produces an output voltage to reduce the drain current of the p-type MOSFET 322 so as to equalize voltages V1 and V2. On the other hand, when voltage V1 is greater than voltage V2, the error amplifier 328 generates an output voltage to increase the drain current of the p-type MOSFET 322 so as to equalize voltages V1 and V2. As a result, by the negative feedback operation by the error amplifier 328, voltages V1 and V2 are equalized and put in a stable state. Therefore, an output voltage of a level corresponding to the levels and difference of voltages VIN(+) and VIN(−) is produced by the error amplifier 328.

The source to drain of the p-type MOSFET 304 and the capacitor 302 are serially connected between the power supply VDD and ground. Further, the gate of the p-type MOSFET 304 is connected to the gate of the p-type MOSFET 322 as well as to the output of the error amplifier 328. In other words, the p-type MOSFETs 304 and 322 are controlled in common by the output voltage from the error amplifier 328 as their control voltage. Therefore, the drain current supplied from the p-type MOSFET 304 to the capacitor 302 increases/decreases with the increase/decrease of the drain current of the p-type. MOSFET 322. In other words, when the drain current of the p-type MOSFET 322 decreases, the gradient when the capacitor 302 is charged changes in the direction of becoming more gradual, and on the other hand, when the drain current of the p-type MOSFET 322 increases, the gradient when the capacitor 302 is charged changes in the direction of becoming steeper.

A charging voltage produced at the non-grounded end of the capacitor 302 is applied to the plus terminal of the comparator 308, and a reference voltage VREF' produced by the reference voltage control circuit 314 is applied to the minus terminal. The comparator 308 outputs a low level in a time period when the charging voltage is lower than the reference voltage VREF' and outputs a high level when the charging voltage exceeds the reference voltage VREF'. In other words, the comparator 308 outputs a frequency signal with a frequency corresponding to the differential voltage between voltages VIN(+) and VIN(−).

The switch 312 is connected in parallel with the capacitor 302 and forms a discharge path to discharge the capacitor 302. A bipolar transistor, a MOSFET, etc., can be employed as the switch element 302.

The input of the control logic circuit 310 is connected to the output of comparator 308 and detects changes in the output of comparator 308 from a low level to a high level (rise transition) and generates a control signal to render switch element 312 on for a certain period. The certain period for which the switch element 312 is rendered on is a period sufficient to discharge the charging voltage of the capacitor 302 and is preset with hardware in the control logic circuit 310.

<<Example Configuration of Reference Voltage Control Circuit>>

The reference voltage control circuit 314 includes a variable current source 330 (inversely proportional variable current source), a first switch element TG1, a second switch element TG2, a third switch element TG3, a capacitor 332 (charge/discharge capacitor), a capacitor 334 (sample-and-hold capacitor), a buffer 336 (output circuit) and a timing control circuit 338 (switch control circuit), and an output from a buffer 336 is applied to the minus terminal of the comparator 308 as the reference voltage VREF'. The first switch element TG1, the second switch element TG2 and the third switch element TG3 are switch circuits recited in the appended claims and a bipolar transistor, a MOSFET, etc., can be employed as the switch circuit.

The variable current source 330, the first switch element TG1 and the capacitor 332 are serially connected between the power supply VDD and ground. The third switch element TG3 is connected in parallel with the capacitor 332. The second switch element TG2 is connected between a non-grounded end of the capacitor 332 and a non-grounded end of the capacitor 334. The timing control circuit 338 controls the open/close timing of the first switch element TG1, the second switch element TG2 and the third switch element TG3. For example, the timing control circuit 338 can control the open/close timing of the first switch element TG1, the second switch element TG2 and the third switch element TG3 by preset hardware logic.

Figure 3:
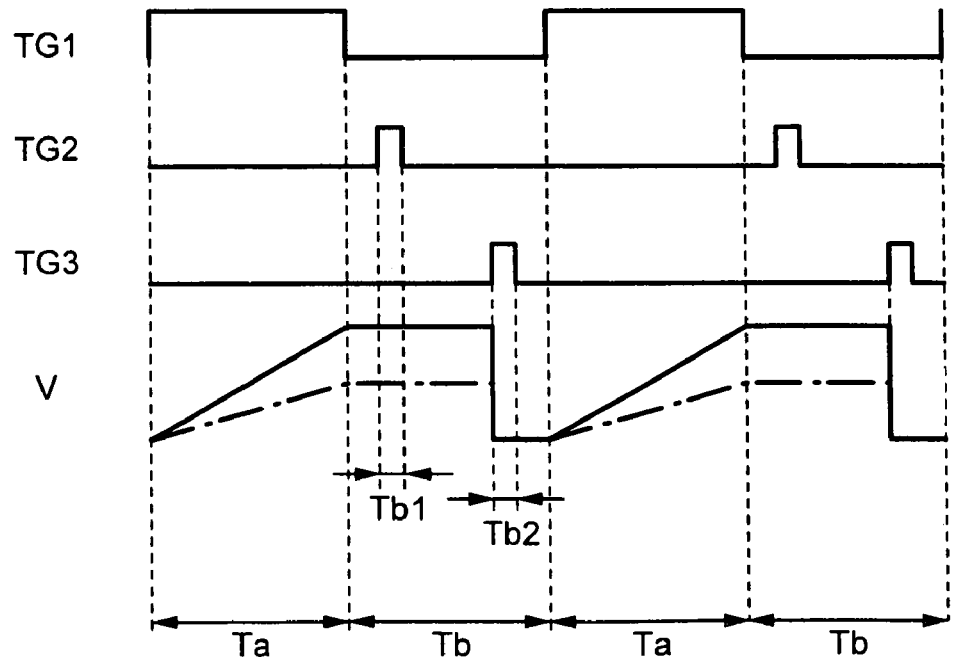
FIG. 3 is a waveform diagram showing the operation of the reference voltage control circuit used in the voltage-frequency conversion apparatus according to the present invention.

The timing control circuit 338 outputs control signals to control the open/close timings of the first switch element TG1, the second switch element TG2 and the third switch element TG3, and the timings at which the control signals are generated are as shown in FIG. 3 which is described later. In order to output the control signals for opening/closing the first switch element TG1, the second switch element TG2 and the third switch element TG3, the timing control circuit 338 includes, for example, an oscillator circuit with a given frequency (not shown), a frequency divider that binarizes an oscillating signal obtained from the oscillator circuit and then divides its frequency to produce a rectangular wave of a given frequency (not shown), a first timer for the second switch element TG2 (not shown), a second timer for the third switch element TG3 (not shown) and first and second pulse generators such as individual monostable multivibrators that can generate pulses of time lengths Tb1 and Tb2 respectively (not shown).

First, the control signal to open/close the first switch element TG1 can be, for example, the rectangular wave obtained from the frequency divider. This control signal, of which one period is the sum of time periods Ta and Tb, is at the high level in time period Ta and at the low level in time period Tb.

The control signal to open/close the second switch element TG2 can be generated with the use of the first timer and the first pulse generator. For example, the timing control circuit 338 detects the control signal for opening/closing the first switch element TG1 falling from the high level to the low level, and in response to the falling starts the first timer counting which is already reset. This first timer generates an overflow signal when a first certain time period has been counted. By supplying this overflow signal to the first pulse generator, the control signal to open/close the second switch element TG2 is generated.

Furthermore, the control signal to open/close the third switch element TG3 can be generated similarly with the use of the second timer and the second pulse generator. That is, the timing control circuit 338, after the first timer counts the first certain time period and outputs an overflow signal, controls the second timer to be reset in response to this overflow signal and start counting a second certain time period. This second timer also generates an overflow signal when the second certain time period has been counted. By supplying this overflow signal to the second pulse generator, the control signal to open/close the third switch element TG3 is generated.

The sum of the first and second certain time periods that are counted by the first and second timers is less than time period Tb−(time length Tb1, part of the first half, +time length Tb2, part of the last half). The time lengths Tb1 and Tb2, in which the respective control signals to open/close the second switch element TG2 and third switch element TG3 are at the high level, are separately located in the first half and last half of the time period Tb, but the invention is not limited to this. For example, both the time lengths Tb1 and Tb2 can be in the middle or later of the time period Tb. Thus, at a timing when the charging voltage V occurring at the non-grounded terminal of the capacitor 332 more reliably becomes stable, the reference voltage VREF' is obtained.

Furthermore, although the control signals to open/close the first switch element TG1, the second switch element TG2 and the third switch element TG3 are generated by hardware in the timing control circuit 338 as described above, they can be generated by software. In this case, the configuration of the timing control circuit 338 can be further simplified.

The voltage produced at the non-grounded end of the capacitor 334 is applied to the buffer 336 and the voltage output from the buffer 336 is applied to the minus terminal of the comparator 308 as the reference voltage VREF'.

<<Example Configuration of Inversely Proportional Variable Current Source>>

Figure 2:
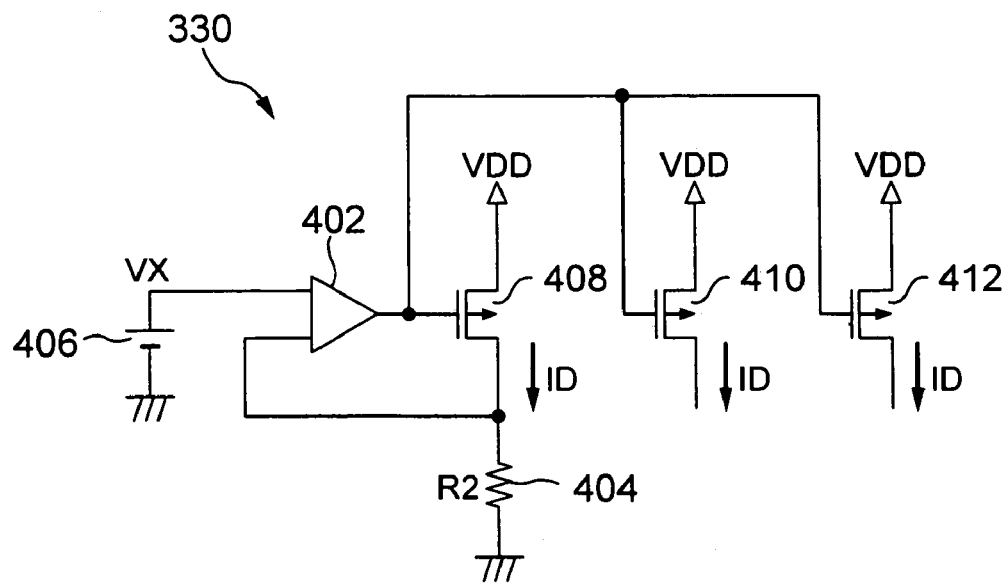
FIG. 2 is a circuit diagram showing an example of a variable current source used in a reference voltage control circuit in the voltage-frequency conversion apparatus according to the present invention.

The variable current source 330 is a current source that supplies a current inversely proportional to the resistance R2 of the second resistor 324. The variable current source 330 is configured with, for example as shown in FIG. 2, an error amplifier 402, a third resistor 404, a reference voltage source 406 and p-type MOSFETs 408 and 410 (transistors). The third resistor 404 has the same resistance of R2 and also the same temperature characteristic as the second resistor 324.

A reference voltage VX produced by the reference voltage source 406 is applied to one input terminal of the error amplifier 402. The source to drain of the p-type MOSFET 408 and the third resistor 404 are serially connected between the power supply VDD and ground. And the gate of the p-type MOSFET 408 is connected to the output terminal of the error amplifier 402 and the non-grounded end of the third resistor 404 is connected to the other input terminal of the error amplifier 402. That is, the drain current of the p-type MOSFET 408 is controlled by the output voltage of the error amplifier 402, and feedback is made via the other input terminal of the error amplifier 402. Hence, the feedback operation of the error amplifier 402 becomes stable with voltage VX occurring at the non-grounded terminal of the third resistor 404. Here, the drain current. ID of the p-type MOSFET 408 flowing through the third resistor 404 is expressed as ID=VX/R2. In other words, the drain current ID of the p-type MOSFET 408 is inversely proportional to the resistance R2 of the second resistor 324. Further, since the third resistor 404 has the same temperature characteristic as that of the second resistor 324, the resistances of the second resistor 324 and the third resistor 404 vary at a same rate depending on the temperature. Therefore, the current ID flowing through the third resistor 404 is certainly inversely proportional to the current flowing through the second resistor 324. In other words, the gate of the p-type MOSFET 408 is controlled by the output voltage of the error amplifier 402 to make the current ID, which is reliably inversely proportional to the current flowing through the second resistor 324, flow through the third resistor 404.

The p-type MOSFET 410 has its source connected to the power supply. VDD and its gate connected to the output terminal of the error amplifier 402. In other words, where the p-type MOSFET 410 is of the same size as the p-type MOSFET 408, the drain current of the p-type MOSFET 410 also equals ID.

The above configuration can be employed for the variable current source 330. In this case, the drain output of the p-type MOSFET 410 is the current output of the variable current source 330.

<Example Configuration of Current Source 316>

A p-type MOSFET 412 that is the same size as the p-type MOSFET 410 can be further provided. The source of this p-type MOSFET 412 is connected to the power supply VDD and the gate is connected to the output terminal of the error amplifier 402. Hence, the drain current of the p-type MOS- FET 412 also equals ID. The current source 316 of FIG. 1 can be replaced by the variable current source configured with the error amplifier 402, the third resistor 404, the reference voltage source 406, and the p-type MOSFETs 408, 412. In this case, if the first resistor 318 and the second resistor 324 are set to have the same resistances and the same temperature characteristic, because a current inversely proportional to the resistance R1 of the first resistor 318 is supplied from the replaced current source 316, the voltage V1 can be maintained constant even if the current flowing through the first resistor 318 varies depending on the temperature. In other words, the error amplifier 328 performs an error amplifying operation with variation in only voltage V2, which is the other input. Hence, the reference voltage VREF' that is applied to the comparator 308 can be reliably decided.

Operation of Voltage-Frequency Conversion Apparatus

<Operation of Reference Voltage Control Circuit>

With reference to FIG. 1 and FIG. 3, the operation of the reference voltage control circuit 314 used in the voltage-frequency conversion apparatus 300 according to the present invention is described. FIG. 3 is a waveform diagram showing the operation of the reference voltage control circuit used in the voltage-frequency conversion apparatus of the present invention. The initial level of the current that is supplied from the variable current source 330 is, for convenience of explanation, set at such a level that the capacitor 332 is charged with a voltage V indicated by the solid line being produced across it. Further, the control signals from the timing control circuit 338 to open/close the first, second, and third switch elements TG1, TG2, and TG3 become the high level respectively when the switch elements TG1 through TG3 are opened and becomes the low level respectively when the switch elements TG1 through TG3 are closed.

First, in time period Ta, the control signal being at the high level is supplied from the timing control circuit 338 to the first switch element TG1, and the control signals being at the low-level are supplied to the second switch element TG2 and the third switch element TG3. Thereby, the second and third switch elements TG2, TG3 are in an open state and only the first switch element TG1 is closed. Thereby, the capacitor 332 is charged from being completely discharged according to the amount of the current supplied from the variable current source 330. As a result, the charging voltage V produced at the non-grounded end of the capacitor 332 rises as shown by the solid line in FIG. 3. Time period Ta when the capacitor 332 is charged is a first time period.

Thereafter, in time period Tb, the control signal being at the low level is supplied from the timing control circuit 338 to the first switch element TG1 throughout this time period; the control signal being at the high level is supplied to the second switch element TG2 in time length Tb1 in the first half of time period Tb, and the control signal being at the high level is supplied to the third switch element TG3 in time length Tb2 in the last half of time period Tb. When time goes from time period Ta to time period Tb, since the first switch element TG1 opens, the capacitor 332 stops being charged and the final charging voltage in time period Ta is maintained as shown by the solid line. This time period when the charging voltage of the capacitor 332 is maintained is a second time period. Then, by the second switch element TG2 being closed during time length Tb1 in time period Tb, the charging voltage of the capacitor 332 is sampled by the capacitor 334 to hold, and this sampled-held voltage is applied to the buffer 336. The voltage applied to the buffer 336 is applied to one end of the comparator 308 as the reference voltage VREF'. Thereafter, by the third switch TG3 being closed during time length Tb2 in time period Tb, the charging voltage of the capacitor 332 discharges in response to the closure of the third switch element TG3. This time length Tb2 is a third time period.

As described above, by repeating the opening/closing of the first, second, and third switch elements TG1, TG2, TG3 in time periods Ta and Tb, the reference voltage VREF' is output from the buffer 336 corresponding to the amount of the current of the variable current source 330.

<Overall Operation>

Figure 4:
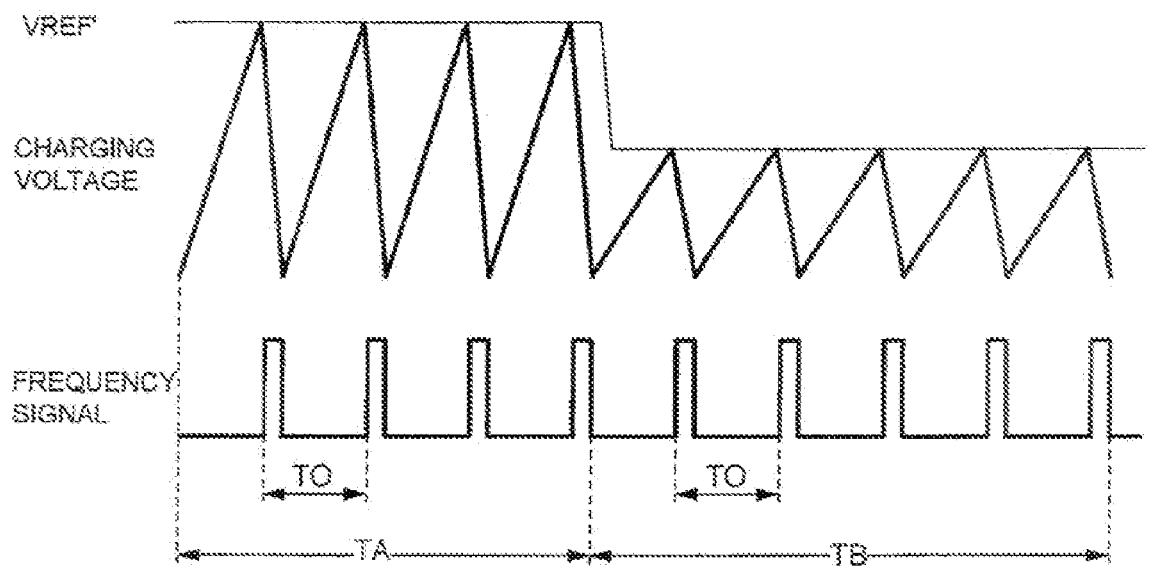
FIG. 4 is a waveform diagram showing the operation of the voltage-frequency conversion apparatus according to the present invention.
Figure 5:
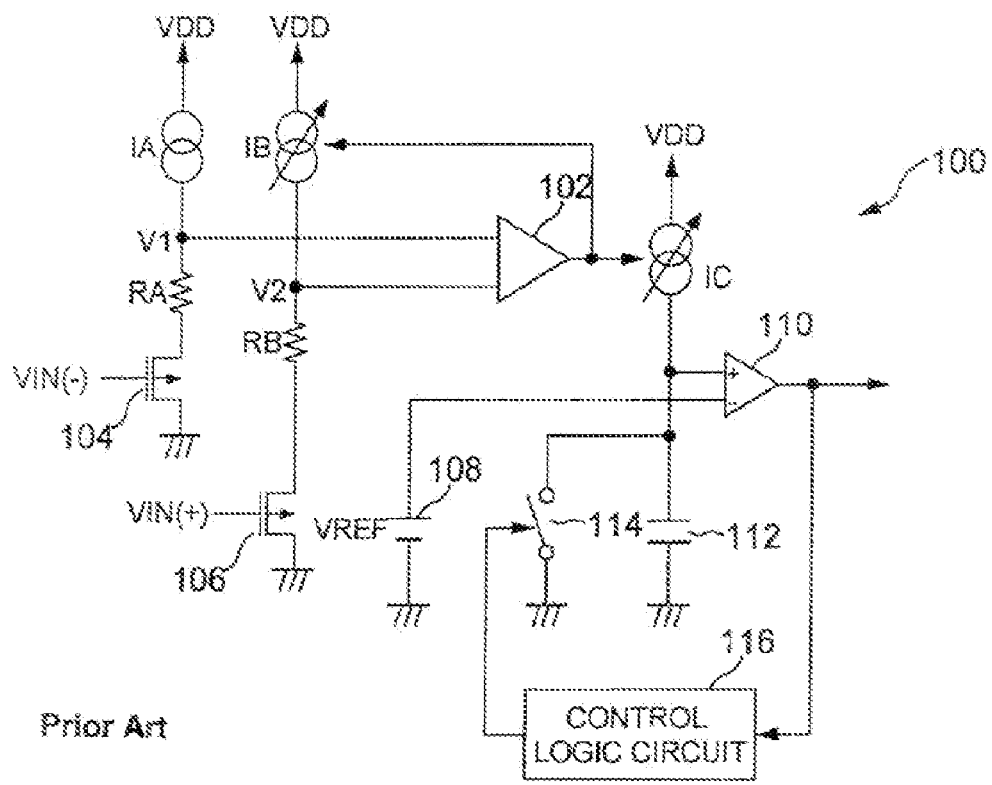
FIG. 5 is a circuit block diagram showing a conventional voltage-frequency conversion apparatus.

With reference to FIGS. 1, 2, 3 and 4, the operation of the voltage-frequency conversion apparatus according to the present invention is described. FIG. 4 is a waveform diagram showing the operation of the voltage-frequency conversion apparatus according to the present invention. The voltage-frequency conversion apparatus 300 is used in, for example, a battery pack 200 shown in FIG. 6. Further, for convenience of explanation, the operation of the voltage-frequency conversion apparatus 300 is explained separately for time period TA and time period TB shown in FIG. 4. It is assumed that in time period TA the resistance of the second resistor 324 does not vary depending on the temperature and in time period TB the resistance of the second resistor 324 varies depending on the temperature.

[Time Period TA]

When the battery pack 200 is mounted in an electronic device, the voltage of electricity charged in the secondary battery 201 is supplied to the electronic device as power supply voltage. In other words, a discharge current flows in an a-direction through the sensing resistor and there is a relationship that voltage VIN(+)<voltage VIN(−), and the voltages VIN(+) and VIN(−) whose differential voltage ΔV is corresponding to the discharging current level are applied to the voltage-frequency conversion apparatus 300 incorporated in the microcomputer 203. Accordingly, a differential voltage of V1−V2 (V1>V2) between the voltage V1 produced at one end of the first resistor 318 and the voltage V2 produced at one end of the second resistor 324 is produced corresponding to the differential voltage ΔV between voltages VIN(+) and VIN(−). So the error amplifier 328 controls the gate voltage of the p-type MOSFET 322 via its output voltage to increase the drain current of the p-type MOSFET 322 so as to equalize voltages V2 and V1. Concurrently, the output voltage of the error amplifier 328 to equalize voltages V1 and V2 is applied to the gate of the p-type MOSFET 304 as a control voltage. Therefore, the drain current of the p-type MOSFET 322 increases as the drain current of the p-type MOSFET 322 increases, and the capacitor 302 is charged by the drain current of the p-type MOSFET 304.

Meanwhile, in the reference voltage control circuit 314, the charging voltage of electricity charged in the capacitor 322 indicated by the solid line in FIG. 3 is sampled and held by the capacitor 334 and then applied to the buffer 336, which applies its output to the minus terminal of the comparator 308 as the reference voltage VREF'.

Then, the comparator 308 compares the charging voltage produced at the non-grounded end of the capacitor 302 applied to the plus terminal and the reference voltage VREF' applied to the minus terminal. When the charging voltage produced at the non-grounded end of the capacitor 302 is lower than the reference voltage VREF', the comparator 308 outputs a low level. Thereafter, when the charging voltage produced at the non-grounded end of the capacitor 302 exceeds the reference voltage VREF', the comparator 308 outputs a high level. When a rise from the low level to the high level is input from the comparator 308, the control logic circuit 310 renders the switch element 312 closed for a certain period. Thereby, the charging voltage of the capacitor 302 is discharged via switch element 312 and the voltage at the non-grounded end of the capacitor 302 becomes lower than the reference voltage VREF' again. Thus, the output of the comparator 308 returns to the low level. By the capacitor 302 repeating the charge and discharge operations as above, a frequency signal with a period of TO is output from the comparator 308.

[Time Period TB]

Assume that the resistance R2 of the second resistor 324 has changed depending on the temperature, for example, for convenience of explanation, description is made of a case when the resistance of the second resistor 324 has become twice the original resistance, 2R2.

Here, the first resistor 318 is assumed to have the same resistance and the same temperature characteristic as the second resistor 324, and since the current source 316 supplies an current that is inversely proportional to the resistance R2 of the second resistor 324, the voltage V1 is held constant. Hence, only the voltage V2 of the voltages applied to the error amplifier 328 can change.

In time period TA, the feedback operation by the error amplifier 328 for the p-type MOSFET 322 is stable with voltages V1 and V2 being equal. However, in time period TB, since the resistance of the second resistor 324 is twice the original resistance value, 2R2, if the drain current of the p-type MOSFET 322 remains the same as that in time period TA, the voltage V2 becomes higher than voltage V1. And so the error amplifier 328, according to the resistance of the second resistor 324 becoming twice, produces an output voltage to reduce the drain current of the p-type MOSFET 322 to half. As a result, the negative feedback operation operates to equalize voltage V2 to voltage V1 again. Therefore the drain current output from the p-type MOSFET 304 also becomes half that in time period TA. Thus, in time period TB, the rise gradient of the charging voltage when the capacitor 302 is charged, becomes half that in time period TA and gradual.

Meanwhile, in the reference voltage control circuit 314, the current produced by the variable current source 330 becomes half as the resistance of the second resistor 324 doubles. Therefore, as shown in FIG. 3, the rise gradient of the charging voltage when the capacitor 332 is charged in time period Ta, as indicated by the dot-and-dash line, becomes half that of the solid line. Accordingly, the charging voltage held by the capacitor 332 in time period Tb is half that of the solid line. Thus, as shown in FIG. 4, the reference voltage VREF' applied to the minus terminal of the comparator 308 in time period TB is half that in time period TA.

In this way, in time period TB shown in FIG. 4, since the rise gradient of the charging voltage produced at the non-grounded end of the capacitor 302 becomes half that in time period TA and the reference voltage VREF' also becomes half that in time period TA, a frequency signal with a period TO is obtained from the comparator 308 like in time period TA.

In the present embodiment, a case when the resistance of the second resistor 324 doubles has been explained, but the invention is not limited to this. That is, whether the resistance of the second resistor 324 increases or decreases depending on the temperature, the same operation as explained above is performed.

By this means, even if the resistance of the second resistor 324 increases depending on the temperature, a frequency signal without frequency variation can be obtained from the comparator 308.

Figure 8:
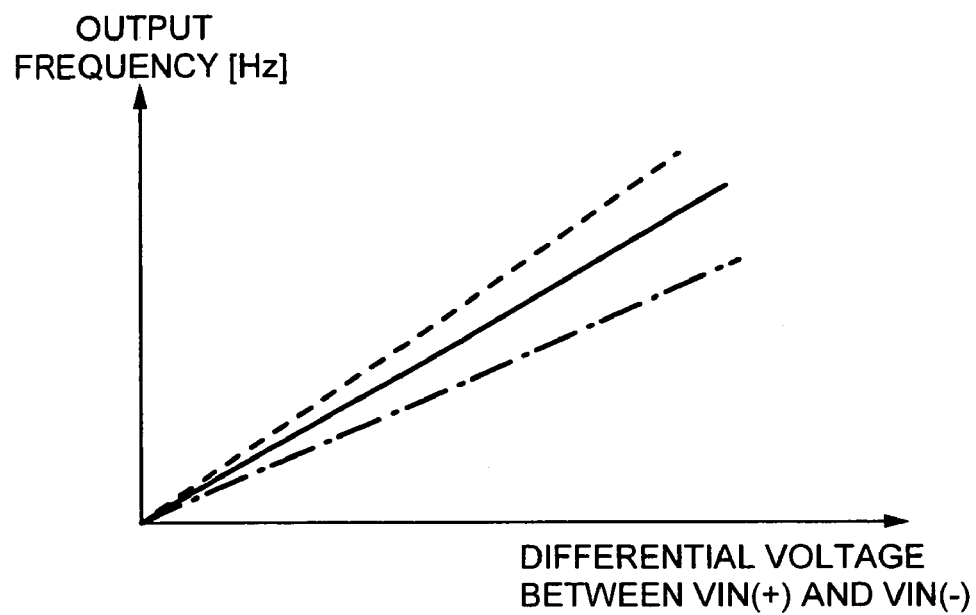
FIG. 8 shows input/output characteristics of a voltage-frequency conversion apparatus.

That is to say, the characteristic as indicated by a solid line in FIG. 8 can be reliably obtained and the remaining voltage of electricity in the secondary battery 201 can be reliably obtained by the microcomputer 203.

Here, let R refer to the resistance R1 of the first resistor 318, the resistance R2 of the second resistor 324, and the resistance R2 of the third resistor 404, and let C be the capacitance of the capacitor 302, $\Delta V$ (positive or negative) be the differential voltage between voltages VIN(+) and VIN(−), I be the current flowing through current source 316, and V (=VREF') be a threshold voltage of the comparator 308 (the input voltage to the minus terminal).

For when the differential voltage $\Delta V$ between voltages VIN(+) and VIN(−) is zero, let t1 be the period of the frequency signal output from the comparator 308, then the following equation is obtained:

$$t1 = C \cdot V/I.$$

For when the differential voltage $\Delta V$ between voltages VIN(+) and VIN(−) is not zero, let t2 be the period of the frequency signal output from the comparator 308, then the following equation is obtained:

$$t2 = C \cdot V/(I + \Delta V/R).$$

For example, where by detecting the number of pulses (rising edges or falling edges) of the frequency signal output from the comparator 308, the remaining voltage of electricity, etc., of the secondary battery 201 is detected, a clock signal CLK of a predetermined frequency that is used in the microcomputer 203 can be utilized. Let T be the period of the clock signal CLK and B·T be a time period to count the number of pulses for, where B is a coefficient.

Then, for when the differential voltage between voltages VIN(+) and VIN(−) is zero, the number of pulses per time B·T that is f1, included in the frequency signal output from the comparator 308 is expressed as follows:

$$f1 = (1/t1) \times B \cdot T = (I/C \cdot V) \times B \cdot T.$$

Similarly, for when the differential voltage $\Delta V$ between voltages VIN(+) and VIN(−) is not zero, the number of pulses per time B·T that is f2, included in the frequency signal output from comparator 308 is expressed as follows:

$$f2 = (1/t2) \times B \cdot T = ((I \cdot R + \Delta V)/C \cdot R \cdot V) \times B \cdot T.$$

The difference $\Delta f$ between the numbers of pulses per time B·T, f1 and f2, is expressed as follows:

$$\Delta f = f2 - f1 = (\Delta V/C \cdot R \cdot V) \times B \cdot T. \quad (1)$$

Next, in the reference voltage control circuit 314, let C2 be the capacitance of the capacitor 332 and I be the current flowing through the variable current source 330 like with the current source 316. Also, let A·T be a time period required to charge the capacitor 332, where A is a coefficient.

In this case, a voltage V applied to the minus terminal of the comparator 308 is expressed as follows:

$$V = (A \cdot T \times V \times /R)/C2. \quad (2)$$

By substituting equation (2) into equation (1), the following equation is obtained:

$$\Delta f = (\Delta V \times C2 \times B)/(C \times V \times A). \quad (3)$$

That is, since equation (3) does not include the R, the frequency signal output from the comparator 308 is not subjected to the temperature characteristics of the first and second resistors 318, 324.

Example Application of Battery Pack

Figure 9:
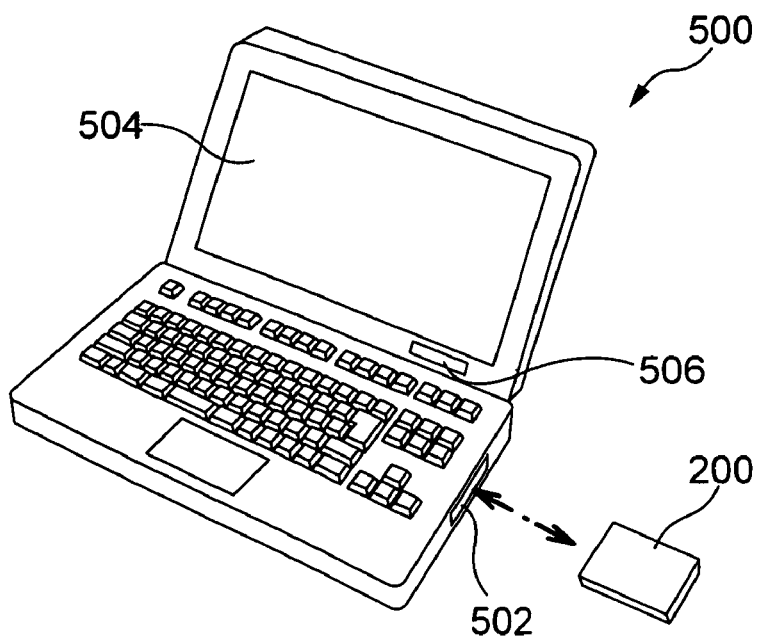
FIG. 9 shows an example of an electronic device having a battery pack applied thereto.

As an example application of the battery pack 200 incorporating the voltage-frequency conversion apparatus 300 of FIG. 1, there is for example a laptop personal computer 500 shown in FIG. 9. By inserting and mounting the battery pack 200 into a battery insert slot 502 provided at the side of this laptop personal computer 500, power can be supplied to allow the laptop personal computer 500 to operate. Further, the remaining voltage of electricity (or available time) of the secondary battery 201 obtained by the microcomputer 203 in the battery pack 200 can be displayed on the edge of a display 504 or on a small display 506 provided exclusively for this purpose. As a method of displaying the remaining voltage of the secondary battery, an indicator display using a bar or a numerical display may be utilized.

The battery pack 200 having the voltage-frequency conversion apparatus 300 may be applied to a digital camera, a cellular phone, etc.

That is, since the accuracy in voltage-frequency conversion can be improved by applying the voltage-frequency conversion apparatus 300, the application will produce a great effect on any portable electronic device that requires an appropriate voltage-frequency conversion result.

As it is obvious from the description above, the voltage-frequency conversion apparatus 300 includes the current amount adjustment circuit 306 that has the p-type MOSFET 304 to charge the capacitor 302, the first resistor 318 for applying voltage VIN(−) and the second resistor 324 for applying voltage VIN(+) and adjusts the drain current of the p-type MOSFET 304 to a level corresponding to the differential voltage between voltages VIN(+) and VIN(−), a comparator 308 to compare in level the charging voltage produced at the non-grounded end of the capacitor 302 and the reference voltage VREF', and the control logic circuit 310 and the switch element 312 as a discharge circuit that makes the capacitor 302 discharge according to the comparing result of the comparator 308 when the charging voltage exceeds the reference voltage VREF'. The voltage-frequency conversion apparatus 300 has the comparator 308 generate a frequency signal according to the differential voltage between voltages VIN(+) and VIN(−) and further comprises the reference voltage control circuit 314 that if the resistance of the first resistor 318 or the second resistor 324 varies depending on the temperature, changes the value of the reference voltage VREF' according to the variation in the resistance of the first resistor 318 or the second resistor 324 in order to maintain constant the frequency of the frequency signal from the comparator 308. With this, even if the resistance of the first resistor 318 or the second resistor 324 varies depending on the temperature, a frequency signal not subjected to their temperature characteristic can be obtained from the comparator 308. That is, the voltage-frequency conversion accuracy of the voltage-frequency conversion apparatus 300 can be reliably prevented from degrading due to the temperature characteristic of the first resistor 318 or the second resistor 324, and good voltage-frequency conversion accuracy can be maintained.

Here, the current amount adjustment circuit 306 includes the current amount adjustment error amplifier 328 for supplying the second resistor 324 and the capacitor 302 with a current according to the differential voltage between voltages VIN(+) and VIN(−).

The reference voltage control circuit 314 includes a variable current source 330 that generates a current inversely proportional to the resistance R2 of the second resistor 324 to which the current according to the differential voltage between voltages VIN(+) and VIN(−) is supplied; a capacitor 332 to be charged and discharged; the first, second, and third switch elements TG1, TG2, TG3 as a switch circuit which charges the capacitor 332 with the use of the current from the variable current source 330 only in the first time period (period Ta in FIG. 3), then holds the charging voltage of the capacitor 332 only in the second time period (from the start of period Tb until the switch element TG3 closes in FIG. 3), thereafter discharges the charging voltage from the capacitor 332 only in the third-time period (period Tb2); the timing control circuit 338 to control the opening/closing of these switch elements; and the buffer 336 to output the reference voltage VREF' from the voltage held across the capacitor 332.

To describe in more detail, the reference voltage control circuit 314 includes the variable current source 330 that generates a current inversely proportional to the resistance R2 of the second resistor 324 to which a current corresponding to the differential voltage between voltages VIN(+) and VIN(−) is supplied; the capacitor 332 to be charged and discharged; the first switch element TG1 that is closed only in the first time period (period Ta in FIG. 3) to charge the capacitor 332 with the current from the variable current source 330; the second switch element TG2 that, in the period Tb when the switch element TG1 is open, is closed only in the second time period (from the start of period Tb until the switch element TG3 closes in FIG. 3) to output reference voltage VREF' from the charging voltage of the capacitor 332; the switch element TG3 that, in the period Tb when the switch element TG1 is open, is closed only in the third time period (period Tb2) after the switch element TG2 is closed in the second time period to discharge the charging voltage of the capacitor 332; and the timing control circuit 338 to control the opening/closing of the first to third switch elements TG1 to TG3.

To describe in even more detail, the reference voltage control circuit 314 includes the variable current source 330 that generates a current inversely proportional to the resistance. R2 of the second resistor 324 to which the current according to the differential voltage between voltages VIN (+) and VIN(−) is supplied; the capacitor 332 to be charged and discharged; the capacitor 334 for sampling and holding; the first switch element TG1 connected between the output of the variable current source 330 and the non-grounded end of the capacitor 332 across which the charging/discharging voltage occurs; the second switch element TG2 connected between one end of the capacitor 332 and the non-grounded end of the capacitor 334 across which the sampled-held voltage occurs; the third switch element TG3 connected in parallel with the capacitor 332; the timing control circuit 338 to control the opening/closing of the first to third switch elements TG1 to TG3; and the buffer 336 to output the sampled-held voltage occurring at the non-grounded end of the capacitor 334 as the reference voltage VREF'. The timing control circuit 338 renders the first switch element TG1 closed only in the first time period (period Ta in FIG. 3) to charge the capacitor 332 with the current from the variable current source 330, and in period Tb when the first switch element TG1 is open, renders the second switch element TG2 closed only in the second time period (from the start of period Tb until the third switch element TG3 closes in FIG. 3) for the capacitor 334 to sample and hold the charging voltage of the capacitor 332, and in period Tb when the first switch element TG1 is open, renders the third switch element TG3 closed only in the third time period (period Tb2) to discharge the charging voltage from the capacitor 332 after the second switch element TG2 is closed in the second time period.

By providing such a reference voltage control circuit 314, from the variable current source 330, a current inversely proportional to the resistance R2 of the second resistor 324 is supplied to the capacitor 332. Therefore, the voltage level to which the capacitor 332 is charged can be changed according to the rise gradient when the capacitor 302 is charged. Specifically, if the rise gradient of the charging voltage when the capacitor 302 is charged changes to n times the original value due to a change in the resistance of the second resistor 324, the reference voltage VREF' also changes to n times the original value. In this way, the voltage-frequency conversion accuracy of the voltage-frequency conversion apparatus 300 can be reliably prevented from degrading due to the temperature characteristic of the second resistor 324, and thus good voltage-frequency conversion accuracy can be maintained.

The variable current source 330 includes the third resistor 404 that has a temperature characteristic identical to that of the second resistor 324 to which a current corresponding to the differential voltage between voltages VIN(+) and VIN(−) is supplied, the error amplifier 402 that operates according to the differential voltage between the voltage produced across the third resistor 404 and the constant voltage VX, and the p-type MOSFET 408 that adjusts the amount of the current being supplied to the third resistor 404 according to the output from the error amplifier 402. The current flowing through the third resistor 404 is the above inversely proportional current. With this simply configured variable current source 330, the current inversely proportional to the resistance of the second resistor 324 can be reliably generated.

The current amount adjustment circuit 306 includes the current source 316 serially connected to the first resistor 318, the p-type MOSFET 320 (a first voltage transistor) serially connected to the first resistor 318, the p-type MOSFET 322 (a first current supply transistor) serially connected to the second resistor 324, the p-type MOSFET 326 (a second voltage transistor) serially connected to the second resistor 324, and the error amplifier 328 that produces as its output voltage a gate voltage for adjusting the drain current of the p-type MOSFET 322 according to voltage V1 at one end of the first resistor 318 decided by the gate voltage (VIN(−)) of p-type MOSFET 320 and the voltage at one end of the second resistor 324 decided by the gate voltage (VIN(+)) of p-type MOSFET 326. A variable current source 304 has the p-type MOSFET 304 (a second current supply transistor) that allows the amount of the current for charging the capacitor 302 to be adjusted according to the output voltage from the error amplifier 328.

Here, the current source 316 may be configured identical to the variable current source 330. That is, while the variable current source 330 is comprised of the error amplifier 402, the third resistor 404, the reference voltage source 406, the p-type MOSFETs 408, 410, the current source 316 may be configured with an error amplifier 402, a third resistor 404, a reference voltage source 406 and p-type MOSFETs 408, 412. In this case, the current source 316 is provided with a p-type MOSFET 412 instead of the p-type MOSFET 410 with respect to the variable current source 330. In this case, since the identical configuration is used for the variable current source 330 and the current source 316, even if the resistance of the second resistor 324 varies depending on the temperature, the period variation of the frequency signal output from the comparator 308 can be reliably prevented.

Further, of the components of the variable current source 330, the current source 316 may share the error amplifier 402, the third resistor 404, the reference voltage source 406 and the p-type MOSFET 408. By this means, the number of circuit elements can be reduced.

Furthermore, the first resistor 318 and the second resistor 324 may be made to have the same temperature characteristic and the same resistance. By this means, the error amplifier 328 performs error amplification in response to the changes in voltage V2 relative to the stable voltage V.

Additionally, voltages VIN(+) and VIN(−) may be voltages produced at both ends of the sensing resistor 202 through which a current from the secondary battery flows. By this means, the remaining voltage of electricity when the secondary battery 201 is discharging, the charging voltage when the secondary battery 201 is being charged, and the like can be reliably obtained.

Moreover, the voltage-frequency conversion apparatus 300 can be an integrated circuit. In this case, external parts are unnecessary allowing downsizing of the microcomputer 203 and the battery pack 200, which leads to cost reduction as well as applicability to various electronic devices.

Although a voltage-frequency conversion apparatus and method for changing the reference voltage thereof according to the present invention has been described in detail, the above description is provided to facilitate the understanding of the present invention and not intended to limit the present invention. It should be understood that various changes and alterations can be made therein without departing from spirit and scope of the invention and that the present invention includes its equivalents.

What is claimed is:

1. A voltage-frequency conversion apparatus comprising:
 a variable current source for charging a capacitor;
 a current amount adjustment curcuit which has a first resistor for applying a first voltage and a second resistor for applying a second voltage and adjusts the amount of a current from the variable current source to be corresponding to a differential voltage between the first voltage and the second voltage, and a current amount adjustment error amplifier for supplying a current corresponding to the differential voltage between the first voltage and the second voltage to either the first resistor or the second resistor, and to the capacitor;
 a comparator that compares in level a charging voltage produced at one end of the capacitor and a reference voltage, and generates a frequency signal according to the differential voltage between the first voltage and the second voltage;
 a discharge circuit that discharges the capacitor according to the comparing result of the comparator when the charging voltage exceeds the reference voltage; and
 a reference voltage control circuit that, when a resistance of the first resistor or the second resistor varies according to its temperature characteristic, changes the value of the reference voltage according to the variation in the resistance of the first resistor or the second resistor so as to maintain constant a frequency of the frequency signal from the comparator,
 wherein the reference voltage control circuit comprises:
  an inversely proportional variable current source that generates a current inversely proportional to the resistance of either the first resistor or the second resistor to which a current corresponding to the differential voltage between the first voltage and the second voltage is supplied,
  a charge/discharge capacitor,
  a switch circuit for charging the charge/discharge capacitor only in a first time period with use of a current from the inversely proportional variable current source, then holding a charging voltage of the charge/discharge capacitor only in a second time period and thereafter discharging the charging voltage of the charge/discharge capacitor only in a third time period,
a switch control circuit that controls opening and closing of the switch circuit, and
an output circuit that outputs the reference voltage from a voltage held across the charge/discharge capacitor.

2. The voltage-frequency conversion apparatus as recited in claim 1, wherein the first resistor and the second resistor have a same temperature characteristic and a same resistance.

3. The voltage-frequency conversion apparatus as recited in claim 1, wherein the reference voltage control circuit comprises
an inversely proportional variable current source that generates a current inversely proportional to the resistance of either the first resistor or the second resistor to which a current corresponding to the differential voltage between the first voltage and the second voltage is supplied;
a charge/discharge capacitor;
a first switch element that is closed only in a first time period for charging the charge/discharge capacitor with use of a current from the inversely proportional variable current source;
a second switch element that is closed only ina second time period in a time period in which the first switch element is open, for outputting the reference voltage from a charging voltage of the charge/discharge capacitor;
a third switch element that is closed only in a third time period in the time period in which the first switch element is open, afterthe second switch element is closed in the second time period, for discharging the charging voltage of the charge/discharge capacitor; and
a switch control circuit that controls opening/closing of the first to third switch elements.

4. The voltage-frequency conversion apparatus as recited in claim 3, wherein the current amount adjustment circuit comprises:
a current source serially connected to the first resistor;
a first voltage transistor serially connected to the first resistor;
a first current supply transistor serially connected to the second resistor;
a second voltage transistor serially connected to the second resistor; and
a current amount adjustment error amplifier that generates a control voltage to adjust the amount of a current of the first current supply transistor according to a voltage at one end of the first resistor that is decided by a control voltage of the first voltage transistor (the first voltage) and to a voltage at one end of the second resistor that is decided by a control voltage of the second voltage transistor (the second voltage), and
the variable current source includes a second current supply transistor that adjusts the amount of a current for charging the capacitor according to the control voltage from the current amount adjustment error amplifier.

5. The voltage-frequency conversion apparatus as recited in claim 1, wherein the reference voltage control circuit comprises:
an inversely proportional variable current source that generates a current inversely proportional to the resistance of either the first resistor or the second resistor to which a current corresponding to the differential voltage between the first voltage and the second voltage is supplied;
a charge/discharge capacitor;
a sample-hold capacitor;
a first switch element connected between an output of the inversely proportional variable current source and one end of the charge/discharge capacitor at which a charge/discharge voltage is produced;
a second switch element connected between the one end of the charge/discharge capacitor and one end of the sample-hold capacitor at which a sampled-held voltage is produced;
a third switch element connected in parallel with the charge/discharge capacitor;
a switch control circuit that controls opening/closing of the first to third switch elements; and
a buffer for outputting as the reference voltage the sampled-held voltage that is produced at the one end of the sample-hold capacitor,
wherein the switch control circuit renders the first switch element closed only in a first time period for charging the charge/discharge capacitor with use of the current from the inversely proportional variable current source, renders the second switch element closed only in a second time period in a time period in which the first switch element is open, for the sample-hold capacitor to sample and hold a charging voltage of the charge/discharge capacitor, and renders the third switch element closed only in a third time period in the time period when the first switch element is open, after the second switch element is closed in the second time period, for discharging the charging voltage of the charge/discharge capacitor.

6. The voltage-frequency conversion apparatus as recited in claim 5, wherein the current amount adjustment circuit comprises:
a current source serially connected to the first resistor;
a first voltage transistor serially connected to the first resistor;
a first current supply transistor serially connected to the second resistor;
a second voltage transistor serially connected to the second resistor; and
a current amount adjustment error amplifier that generates a control voltage to adjust the amount of a current of the first current supply transistor according to a voltage at one end of the first resistor that is decided by a control voltage of the first voltage transistor (the first voltage) and to a voltage at one end of the second resistor that is decided by a control voltage of the second voltage transistor (the second voltage), and
the variable current source includes a second current supply transistor that adjusts the amount of a current for charging the cpacitor according to the control voltage from the current amount adjustment error amplifier.

7. The voltage-frequency conversion apparatus as recited in claim 1, wherein the inversely proportional variable current source includes:
a third resistor that has a same temperature characteristic as either the first resistor or the second resistor to which the current corresponding to the differential voltage between the first voltage and the second voltage is supplied;
an error amplifier that operates according to a differential voltage between a voltage produced across the third resistor and a constant voltage; and a transistor that adjusts the amount of a current being supplied to the third resistor according to an output of the error amplifier, and the current flowing through the third resistor is equal to the inversely proportional current.

8. The voltage-frequency conversion apparatus as recited in claim 7, wherein the current amount adjustment circuit comprises:

a current source serially connected to the first resistor;

a first voltage transistor serially connected to the first resistor;

a first current supply transistor serially connected to the second resistor;

a second voltage transistor serially connected to the second resistor; and a current amount adjustment error amplifier that generates a control voltage to adjust the amount of a current of the first current supply transistor according to a voltage at one end of the first resistor that is decided by a control voltage of the first voltage transistor (the first voltage) and to a voltage at one end of the second resistor that is decided by a control voltage of the second voltage transistor (the second voltage), and the variable current source includes a second current supply transistor that adjusts the amount of a current for charging the capacitor according to the control voltage from the current amount adjustment error amplifier.

9. The voltage-frequency conversion apparatus as recited in claim 1, wherein the current amount adjustment circuit comprises:

a current source serially connected to the first resistor;

a first voltage transistor serially connected to the first resistor;

a first current supply transistor serially connected to the second resistor;

a second voltage transistor serially connected to the second resistor; and a current amount adjustment error amplifier that generates a control voltage to adjust the amount of a current of the first current supply transistor according to a voltage at one end of the first resistor that is decided by a control voltage of the first voltage transistor (the first voltage) and to a voltage at one end of the second resistor that is decided by a control voltage of the second voltage transistor (the second voltage), and the variable current source includes a second current supply transistor that adjusts the amount of a current for charging the capacitor according to the control voltage from the current amount adjustment error amplifier.

10. The voltage-frequency conversion apparatus as recited in claim 9, wherein the current source has a same configuration as the inversely proportional variable current source.

11. The voltage-frequency conversion apparatus as recited in claim 9, wherein the control voltages of the first voltage transistor and the second voltage transistor are voltages produced at both ends of a sensing resistor through which a current from a secondary battery flows.

12. The voltage-frequency conversion apparatus as recited in claim 9, wherein the inversely proportional variable current source has components shared with the current source.

* * * * *